United States Patent [19]

Nawaki et al.

[11] Patent Number: 5,006,725
[45] Date of Patent: Apr. 9, 1991

[54] PULSE GENERATOR FOR USE IN AN INTEGRATED CIRCUIT

[75] Inventors: Masaru Nawaki; Yasuo Torimaru, both of Nara, Japan

[73] Assignee: Sharp Kabushiki Kaisha, Osaka, Japan

[21] Appl. No.: 347,711

[22] Filed: May 5, 1989

[30] Foreign Application Priority Data

May 13, 1988 [JP] Japan .................................. 63-117944

[51] Int. Cl.⁵ .............................................. H03K 3/07
[52] U.S. Cl. .................................... 307/106; 307/107; 307/265; 307/273
[58] Field of Search .................. 307/105–110, 307/260, 262, 263, 265, 266, 267, 268, 272.1, 273, 290, 354, 360, 279, 592, 594, 597, 601, 602; 328/55

[56] References Cited

U.S. PATENT DOCUMENTS

| 3,657,568 | 4/1972 | Dargent | 307/268 |
| 3,862,440 | 1/1975 | Suzuki et al. | 307/269 X |
| 4,583,008 | 4/1986 | Grugett | 307/265 |
| 4,692,637 | 9/1987 | Shoji | 307/594 X |
| 4,716,318 | 12/1987 | Koike | 307/265 X |
| 4,757,214 | 7/1988 | Kobayashi | 307/265 |
| 4,820,943 | 4/1989 | Makino et al. | 307/594 X |
| 4,837,466 | 6/1989 | Kanauchi | 307/601 X |

FOREIGN PATENT DOCUMENTS

| 0198254 | 10/1986 | European Pat. Off. | 307/265 |
| 0000123 | 1/1987 | Japan | 307/265 |

Primary Examiner—Paul Ip

[57] ABSTRACT

A pulse generating unit including a delay unit for delaying an input signal of the pulse generating unit and a comparator unit for comparing an output signal of the delay unit with the above mentioned input signal, wherein the delay unit comprises one inverter for inverting the above mentioned input signal and for delaying the pulse fall time of the pulse fall edge of the inverted input signal, whereby the pulse generator generates an output pulse signal with a constant pulse duration even in the case where the pulse duration of the input pulse signal is shorter than the delay time of the delay unit.

2 Claims, 2 Drawing Sheets

PULSE GENERATOR FOR USE IN AN INTEGRATED CIRCUIT

BACKGROUND OF THE INVENTION

1. Field of the Invention

The present invention relates to a pulse generator for use in an integrated circuit arrangement.

2. Description of the Prior Art

As shown in FIG. 1, a conventional pulse generator comprises a delay circuit unit 11 having three inverters 10 connected in series and a comparator unit consisting of a NAND gate unit 12 with dual input terminals, wherein the output terminal 11a of the delay unit 11 is connected to one input terminal 12a of the dual input NAND unit 12, and the input terminal 11b of the delay unit 11 is coupled with the other input terminal 12b of the dual input NAND unit 12. The coupled common terminal of both said input terminals 11b and 12b is used as a signal input terminal 13 of the pulse generator and an output terminal 12c of the dual input NAND unit 12 is used as a signal output terminal 14 of the pulse generator.

In the conventional pulse generator as described above, if a pulse signal P1 with a sufficiently long pulse duration is entered as an input signal for the pulse generator, a pulse signal P2 is generated from the signal output terminal 14 of the pulse generator with a constant pulse duration rising up at the time of the rising edge of the pulse signal P1. At this time, the pulse duration of the output pulse signal P2 is equal to the delay time $t_3$ of the delay unit 11.

Therefore, if it is necessary to generate an output pulse signal with a long pulse duration, the delay unit is constituted with an odd number of inverters connected in series according to the necessity of the pulse duration. Moreover, in FIG. 2, the signal P3 is an output pulse signal of the delay unit 11 which is applied to the other input terminal 12a of the dual input NAND gate 12.

However, as shown by dotted lines in FIG. 2, there has been a problem in the conventional pulse generator mentioned above that, when the pulse duration of the input pulse signal P1 is shorter than the delay time $t_3$ of the delay unit 11, the pulse duration of the output pulse signal P2 becomes equal or shorter than that of the input pulse signal P1, and furthermore it occasionally occurs that an output pulse signal can not be obtained in a specific delay unit 11 with a specific delay characteristic.

SUMMARY OF THE INVENTION

The present invention has been made considering the problem mentioned above, and an essential object of the present invention is to provide a pulse generating unit by which an output pulse signal can be surely obtained with a constant pulse duration even in the case where a pulse duration of an input pulse signal is shorter than a delay time of a delay unit.

In order to accomplish the object mentioned above, the pulse generating unit according to the present invention comprises a delay unit for delaying an input signal of the pulse generating unit and a comparator unit for comparing an output signal of the delay unit with the above mentioned input signal thereof, wherein said delay unit comprises one inverter for inverting the input signal and for delaying the pulse fall time of the pulse fall edge of the inverted input signal, whereby said pulse generator generates an output pulse signal with a predetermined pulse duration.

The inverter of the delay unit inverts the input signal and delays the pulse fall time of the pulse fall edge of the inverted input signal, whereby the pulse duration of the output pulse signal is determined on the basis of the period when the output signal of the inverter is varied to a logic input inverting level of the comparator.

BRIEF DESCRIPTION OF THE DRAWINGS

The present invention will become more fully understood from the detailed description given hereinbelow and the accompanying drawings which are given by way of illustration only, and thus, are not limitative of the present invention, and wherein.

DETAILED DESCRIPTION OF THE PREFERRED EMBODIMENT

A preferred embodiment of a pulse generator according to the present invention will be described hereinafter with reference to FIGS. 3 and 4.

Figure 1:
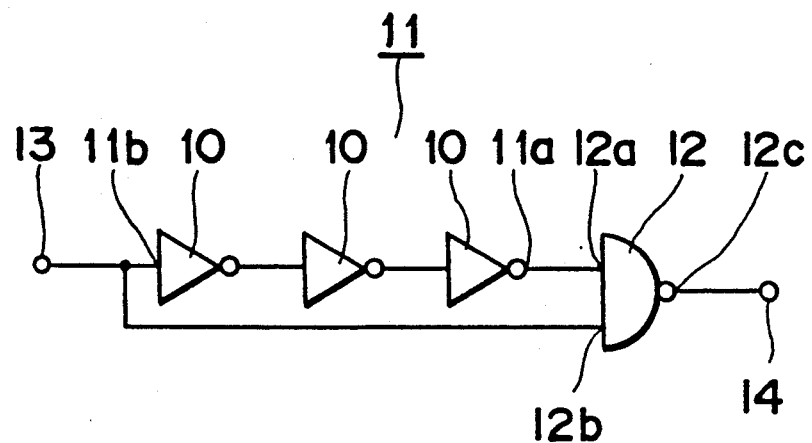
FIG. 1 is a circuit diagram illustrating a conventional pulse generator.
Figure 2:
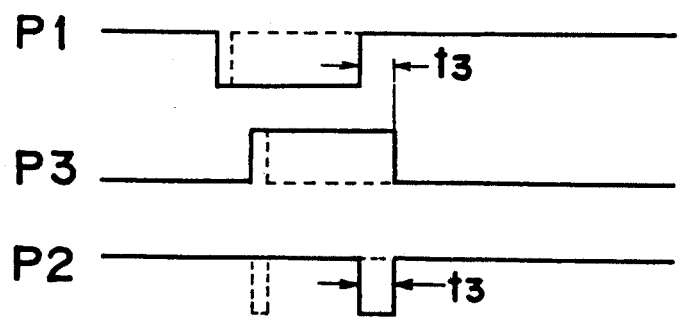
FIG. 2 is an operational timing chart illustrating the relationship between an input signal, an inverted signal and an output signal in the conventional pulse generator.
Figure 3:
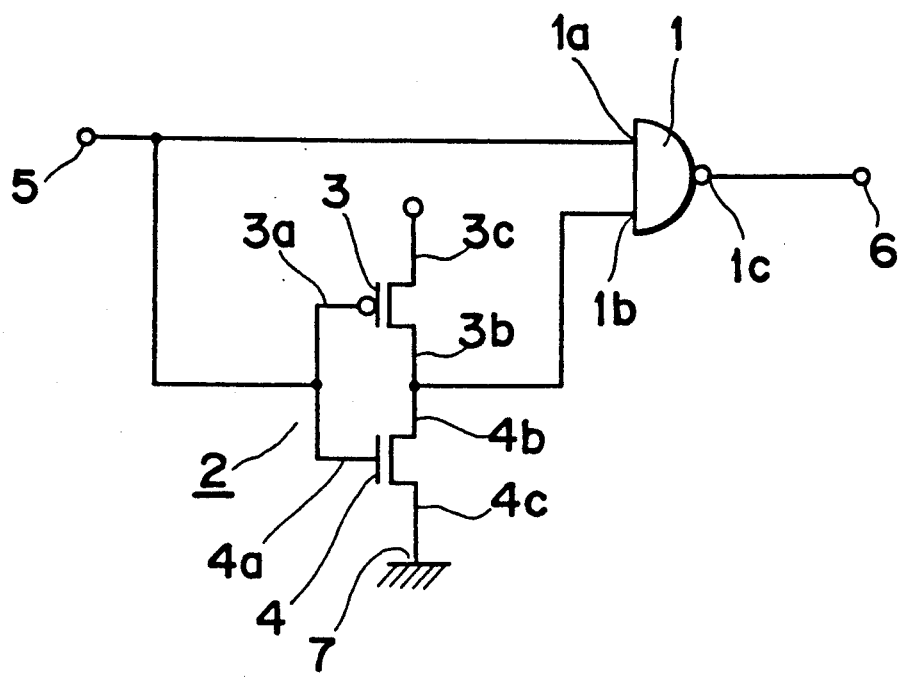
FIG. 3 is a circuit diagram illustrating an embodiment of a pulse generator according to the present invention.

In FIG. 3, reference numeral 1 denotes a dual input NAND gate unit operating as a comparator for comparing an input signal applied to one input terminal 1a of the NAND gate 1 with an output signal of an inverter 2 applied to the other input terminal 1b of the NAND gate 1. The dual input NAND unit 1 used may be a gate IC (integrated circuit) of TTL (transistor transistor logic) or CMOS (complementary metal-oxide semiconductor) design which is known in the art. The inverter 2 comprises a P-channel MOS-FET (metal-oxide semiconductor field-effect-transistor) 3 and a N-channel MOS-FET 4. The gate 3a of the P-channel MOS-FET 3 and the gate 4a of the N-channel MOS-FET 4 are respectively coupled together and connected to the input terminal 1a of the dual input NAND unit 1. The sources 3b and 4b of the respective MOS-FETs 3 and 4 are coupled together and connected to the other input terminal 1b of the dual input NAND unit 1. The drain 3c of the P-channel MOS-FET 3 is connected to a power source (not shown) and the drain 4c of the N-channel MOS-FET 4 is connected to ground 7. The input terminal 1a of the dual input NAND unit 1 is connected to the signal input terminal 5 of the pulse generator and the output terminal 1c of the dual input NAND unit 1 is connected to the signal output terminal 6 of the pulse generator.

An N-channel MOS-FET 4 having a transistor gain $\beta_n$ smaller than the transistor gain $\beta_p$ of the P-channel MOS-FET 3 is used in the inverter 2. In this case, it is preferable that the ratio of the transistor gain $\beta_p$ to the transistor gain $\beta_n$ is in the range of 10 to 1.

Next, the operation of a preferred embodiment of the present invention is described hereinafter.

Figure 4:
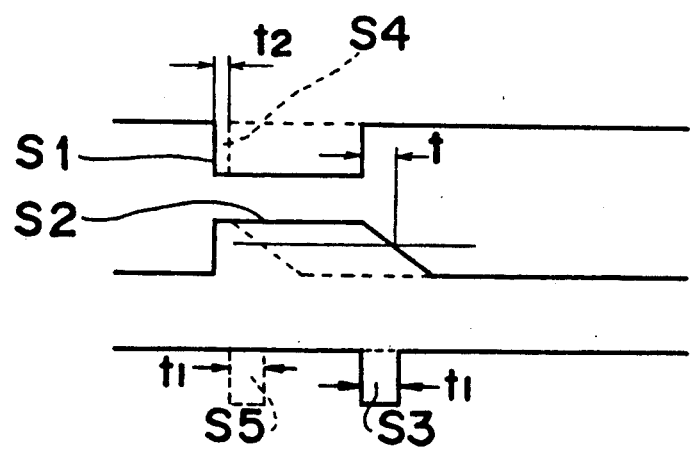
FIG. 4 is an operational timing chart illustrating the relationship between an input signal, an inverted signal and an output signal in the pulse generator according to the present invention.

When an input pulse signal S1, as shown by the real line in FIG. 4, is applied to the signal input terminal 5, the input pulse signal S1 is applied to both the dual input NAND gate 1 and the inverter 2.

The inverter 2 inverts the input pulse signal S1 and delays the pulse fall time of the pulse fall edge of the pulse signal S1 so as to generate the inverted signal S2. The inverted signal S2 is then applied to the input terminal 1b of the dual input NAND gate 1. The pulse fall edge of the inverted signal S2 is changed less abruptly than the pulse rise edge and a delay time t, which is determined on the basis of the delay characteristic of the inverter 2, is required for the pulse fall edge of the inverted signal S2 to fall down to a logic inverting level (threshold level) of the dual input NAND gate 1. The delay time t is determined on the basis of the transistor gains $\beta_n$ and $\beta p$, and is desirably nsec several nsec to several ten nsec. For example, when the transistor gains $\beta_n$ and $\beta p$ are respectively 1 and 10, the delay time t becomes 10 nsec.

The dual input NAND gate 1 compares the pulse signal S1 applied to the input terminal 1a with the inverted pulse signal S2 applied to the other input terminal 1b so as to obtain S1 AND S2, to thereby generate a pulse signal S3 having a pulse duration $t_1$ of a period from the time when the pulse signal S1 rises up to H level to the time when the inverted signal S2 falls down below the logic inverting level of the dual input NAND gate 1. In other words, the pulse duration $t_1$ of the pulse signal S3 becomes equal to the delay time t of the pulse signal S1 delayed by the inverter 2.

Moreover, as shown by dotted lines in FIG. 4, even though the pulse duration $t_2$ of the pulse signal S4 applied to the signal input terminal 5 is shorter than the delay time t delayed by the the inverter 2, there can be obtained a pulse signal S5 of a pulse duration $t_1$ which is the same as the pulse duration of the pulse signal S1.

As described above, according to the present invention, it becomes possible to provide a pulse generator which generates an output pulse signal with a constant pulse duration in spite of any pulse duration of the input pulse signal to be applied.

What is claimed is:

1. A pulse generating unit for generating an output signal having a predetermined pulse duration comprising:

delay means, coupled to a pulse signal input, for outputting a delayed-inverted pulse signal in which only pulse falling edges are delayed, said delay means comprised of only a single P-channel/N-channel MOS-FET pair inverter circuit, the transistor gain of said N-channel MOS-FET smaller than the transistor gain of said P-channel MOS-FET; and comparator means, for comparing said pulse signal input with said delayed-inverted pulse signal and for outputting the output signal having the predetermined pulse duration, said comparator means comprised of a dual input NAND gate unit, the predetermined pulse duration of the output signal of said comparator means has the same length as that of the delay time of said single P-channel/N-channel MOS-FET pair inverter circuit.

2. A pulse generating unit comprising:

an inverter comprising only a single P-channel/N-channel MOS-FET pair, coupled to a pulse signal input, for delaying only the falling edges of said pulse signal input to provide a delayed-inverted pulse signal output, the gain of said N-channel MOS-FET smaller than the gain of said P-channel MOS-FET; and a dual-input NAND gate, coupled to and comparing said pulse signal input and said delayed-inverted pulse signal output, for outputting a pulse signal of predetermined pulse duration which has the same length as that of the delay time of said single P-channel/N-channel MOS-FET pair inverter circuit.

* * * * *